(12) United States Patent
Li

(10) Patent No.: US 7,231,117 B2
(45) Date of Patent: Jun. 12, 2007

(54) APPARATUS FOR STABILIZING LASER WAVELENGTH

(75) Inventor: Ruolin Li, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/248,977

(22) Filed: Oct. 11, 2005

(65) Prior Publication Data

US 2006/0039652 A1 Feb. 23, 2006

Related U.S. Application Data

(62) Division of application No. 10/425,279, filed on Apr. 28, 2003, now abandoned.

(51) Int. Cl.
*G02B 6/34* (2006.01)
*G02B 6/26* (2006.01)
*G02B 6/42* (2006.01)
*G02B 6/10* (2006.01)

(52) U.S. Cl. .................. 385/37; 385/15; 385/31; 385/129; 385/130; 385/131; 385/132

(58) Field of Classification Search .......... 385/37, 385/15, 31, 129–132
See application file for complete search history.

(56) References Cited

U.S. PATENT DOCUMENTS

| | | | |
|---|---|---|---|
| 6,137,939 A * | 10/2000 | Henry et al. .............. | 385/132 |
| 6,151,438 A | 11/2000 | Espindola et al. | |
| 6,243,517 B1 * | 6/2001 | Deacon ..................... | 385/50 |
| 6,320,888 B1 * | 11/2001 | Tanaka et al. ............ | 372/32 |
| 6,341,189 B1 | 1/2002 | Deacon | |
| 2002/0018507 A1 | 2/2002 | Deacon | |
| 2004/0005108 A1 | 1/2004 | Johannessen | |
| 2004/0223713 A1 | 11/2004 | Li | |

FOREIGN PATENT DOCUMENTS

WO WO 01/04999 A1 1/2001

OTHER PUBLICATIONS

Kokubun, Yasuo et al., "Athermal Waveguides for Temperature-Independent Lightwave Devices," IEEE Photonics Technology Letters, vol. 5, No. 11, pp. 1297-1300, Nov. 1993.
Kokubun, Yasuo et al., "Temperature-Independent Optical Filter at 1.55μm Wavelength using a Silica-Based Athermal Waveguide," IEEE Electronics Letters, vol. 34, No. 4, pp. 367-369, Feb. 19, 1998.
Tada, K. et al., "Temperature Compensated Coupled Cavity Diode Lasers," Optical and Quantum Electronics, vol. 16, No. 5, pp. 463-469, Sep. 1984.

\* cited by examiner

*Primary Examiner*—Brian Healy
*Assistant Examiner*—Jerry Martin Blevins
(74) *Attorney, Agent, or Firm*—Trop, Pruner & Hu, P.C.

(57) ABSTRACT

A technique to stabilize the effective refraction index of a laser generating system's wave guide, as well as a technique to stabilize the phase of the wave guide. In at least one embodiment of the invention, a polymer is used within the wave guide to counteract the effects of temperature on the clad material of the wave guide in order to create an overall effective refraction index that is substantially independent of temperature variations. Furthermore, in at least one embodiment of the invention relative segment lengths of the wave guide are chosen to stabilize the phase of the wave guide.

32 Claims, 3 Drawing Sheets

APPARATUS FOR STABILIZING LASER WAVELENGTH

CROSS-REFERENCE TO RELATED APPLICATIONS

The present application is a divisional application of and claims the priority date of U.S. patent application Ser. No. 10/425,279 entitled "TECHNIQUES FOR STABILIZING LASER WAVELENGTH AND PHASE," filed Apr. 28, 2003 now abandoned and assigned to the assignee of the present invention.

Embodiments of the invention relate to laser technology. More particularly, embodiments of the invention relate to stabilizing a laser's wavelength or phase across multiple wave guide temperatures by using materials within the wave guide having varying temperature reaction characteristics.

BACKGROUND

Lasers are focused, intense light rays of a particular wavelength or wavelength range that may be used for various functions, including reading data from a medium, such as a compact disc, surgical incisions, and creating semiconductor device features. Lasers, however, can be sensitive to temperature variations among structures within the laser generating system. This is due, at least in part, to temperature sensitivity of light refraction indices in various materials used within the laser generating system.

FIG. 1 illustrates a prior art system for generating a laser. The raw light for the laser is generated and amplified by a semiconductor optical amplifier (SOA) chip. The light generated by the SOA enters a wave guide consisting of a clad material, a wave guide core, and series of grating lenses (grating) in order to direct and refine the laser down to a desired wavelength and phase. After light enters the wave guide, it is passed through the grating, which consists of a series of lenses that can pass the desired wavelength and reflect others.

As a result, the light, excluding the desired wavelength, continually reflects from the grating toward the SOA chip. The effect is a laser produced from the wave guide that is of a desired wavelength and phase. The desired wavelength is passed by the grating, whereas the desired phase is produced by placing the grating at a distance from the SOA chip such that the round trip distance of the reflected light is an integer division of the desired wavelength.

Unfortunately, the wave guide clad material and the wave guide core material can change temperature during the course of generating the laser, which can, in turn, change the refraction indices of the wave guide core and clad materials. The refraction index of a material is an indicator of the material's ability to pass or reflect certain frequencies of light. As the refraction index of the clad or core material changes with temperature, less of a particular wavelength of light may be reflected and therefore propagated through the wave guide, resulting in loss of laser intensity or a change in the laser's wavelength.

As a laser travels through the wave guide core, it can be effected by the overall effective refraction index of a substantially cylindrical area surrounding the wave guide core known as the optical mode. FIG. 2 illustrates a cross-sectional view of the wave guide, in which the cross-section of the optical mode is indicated by the red circle. The material within the boundary of the optical mode can effect the light traveling through the core if the temperature of the material changes, due to the resulting change in the refraction index of the material within the optical mode.

Adverse effects on a laser due to temperature sensitivity of refraction indices of materials has been addressed in prior art laser generating systems by using power-consuming devices, such as a thermal electric cooler (TEC). The TEC may be used to cool the wave guide within the optical mode as the wave guide temperature increases from the laser generating process. Through what can be an elaborate technique of detecting the optical mode temperature and adjusting the TEC accordingly, the temperature of the wave guide in the optical mode can remain stable enough to generate a laser that is of substantially the desired wavelength and phase for a particular application.

The TEC, however, can have adverse effects on system power consumption, system cost, and system reliability. Furthermore, the accuracy of the laser's wavelength and phase, using a TEC, is, at least in part, a function of how quickly the TEC can respond to temperature variations within the optical mode without over-compensating for them. As a result, the overall accuracy of the laser can be compromised.

BRIEF DESCRIPTION OF THE DRAWINGS

Embodiments of the invention are illustrated by way of example and not limitation in the figures of the accompanying drawings, in which like references indicate similar elements and in which.

DETAILED DESCRIPTION

Embodiments of the invention pertain to the generation of a laser of a desired wavelength and phase. More particularly, embodiments of the invention pertain to using certain materials within the wave guide of a laser generation system, such that the refraction indices of the materials contribute to an overall substantially constant effective refraction index of the optical mode of the wave guide, which is largely independent of temperature variations.

Stabilization of a laser wavelength within a laser generating system can be achieved more reliably, accurately, and inexpensively than in many prior art techniques by introducing a material into the wave guide clad that has inverse refraction characteristics to those of the clad material across temperature variances.

For example, the refraction index of the clad material may increase with temperature, thereby causing the overall effec tive refraction index of the wave guide within the optical mode to increase, which may then effect the wavelength, intensity, or other characteristics of the laser produced. Adding a material to the wave guide within the optical mode whose refraction index decreases with increasing temperature can help to counter this effect, creating an overall effective refraction index within the optical mode that is substantially the same across varying temperatures.

Figure 1:
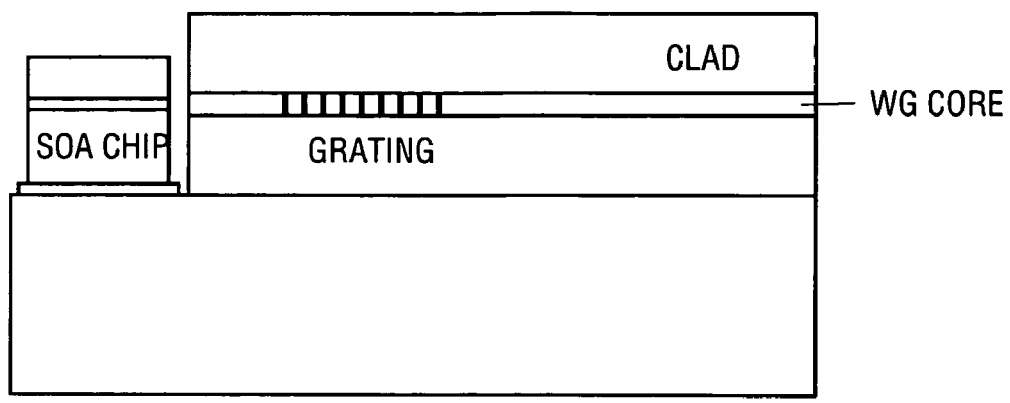
FIG. 1 illustrates a prior art laser generating system.
Figure 2:
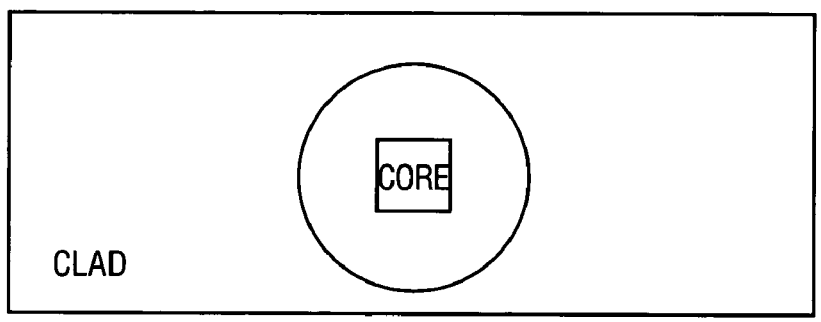
FIG. 2 illustrates an optical mode within a prior art laser generating system.
Figure 3:
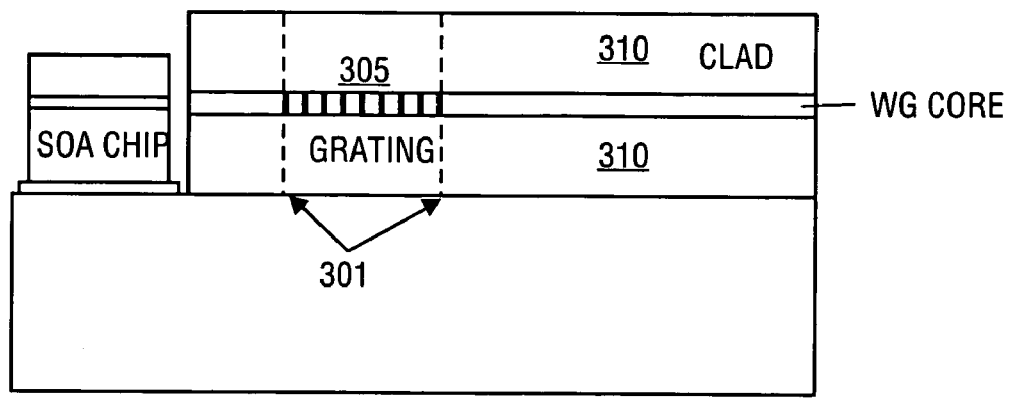
FIG. 3 illustrates a laser generating system according to one embodiment of the invention, in which a polymer is added to the wave guide.

FIG. 3 illustrates one embodiment of the invention in which a polymer is added to the wave guide clad material in order to offset the effect of temperature-induced refraction index changes of the clad material within the optical mode. In FIG. 3, a polymer 301 is added to the clad at opposite ends of the grating 305 in order to stabilize the effective refractive index of the clad 310 across the grating region. This is but one example, however, of where the polymer may be placed within the clad in order to have the desired effect. Furthermore, the polymer may be placed throughout the clad in various positions and quantities depending upon the clad material used and the particular design needs of the laser generating system.

A laser's wavelength is stabilized across varying clad temperatures in at least one embodiment of the invention, by using appropriate proportions of clad material and polymer within the optical mode of the wave guide.

Figure 4:
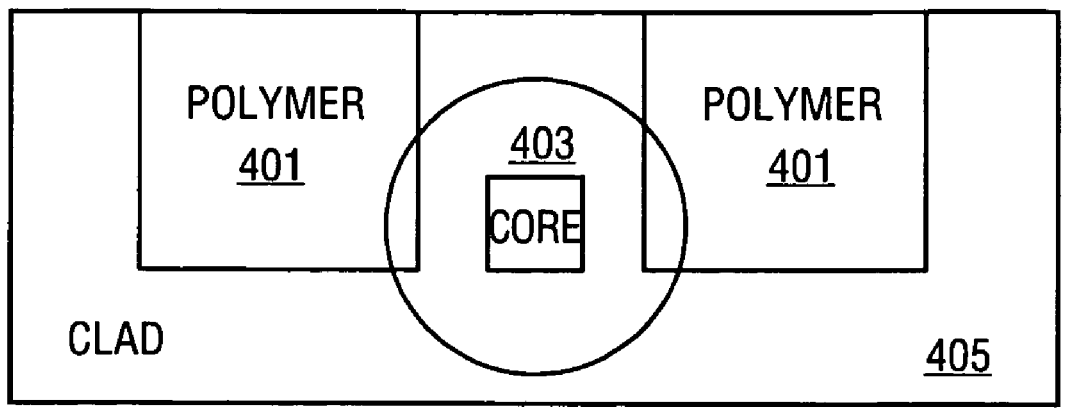
FIG. 4 illustrates a cross-sectional view of a laser generating system according to one embodiment of the invention in which a polymer exists within the optical mode on opposite sides of the wave guide.

FIG. 4 illustrates a cross section of a wave guide according to one embodiment of the invention, in which the polymer and clad material exist within the optical mode of the wave guide in suitable proportions to have the desired stabilizing effect. The cross-sectional area of the polymer 401 that exists within the optical mode 403 in order to effectively offset the temperature-induced variations of the refraction index of the clad material 405 is determined in the embodiment illustrated in FIG. 4 by the equation:

$$n_{eff,grating} = \frac{n_{polymer} \cdot a_{polymer} + n_{core} \cdot a_{core} + n_{clad} \cdot a_{clad}}{a_{polymer} + a_{core} + a_{clad}}$$

In the above equation, the effective refraction index within the grating region is a function of the multiplicative product of the refractive indices ($n_{polymer}$, $n_{core}$, and $n_{clad}$) of the various materials within the optical mode and the areas ($a_{polymer}$, $a_{core}$, and $a_{clad}$) of the optical mode that they occupy.

Figure 5:
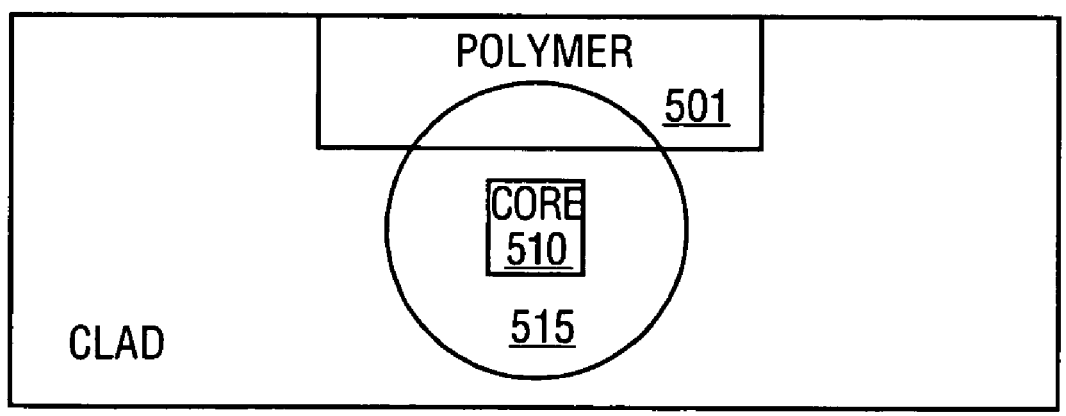
FIG. 5 illustrates a cross-sectional view of a laser generating system according to one embodiment of the invention in which a polymer exists within the optical mode on one side of the wave guide.

In other embodiments of the invention, other methods of determining the proportion of clad, core, and polymer and their relative positions in the optical mode in order to stabilize the effective refraction index of the laser generating device may be used. For example, FIG. 5 illustrates one embodiment of the invention in which the polymer exists on only one side of the core. However, the proportion of areas of core 510, polymer 501, and clad 505 within the optical mode 515 are such that the above equation is satisfied.

The desired wavelength that is passed by the grating in the embodiment illustrated in FIG. 4 is determined by the equation:

$$\lambda_0 = n_{eff,grating} \cdot \Lambda$$

In the above equation, the effective grating refraction index at the grating region is multiplied by the period of the grating, denoted by the upper-case lambda. The period of the grating is determined in part by the periodic modulation of the portion of the optical mode's effective refraction index that surrounds the grating length. Within the length of the grating, one half of the period of the light that passes through it has a slightly higher index than the other half due to the changing effective refraction index from one end of the grating to the other. Because of this small index difference, each lens of the grating behaves like a weak mirror, partially reflecting the laser as it passes through. Therefore, the period of the grating is a function of the thickness of each lens.

In addition to the wavelength of the laser, the phase of the laser may be adversely effected by temperature changes within the optical mode of the wave guide. This effect can occur, for example, if the refraction index changes within the optical mode of the portion of the wave guide in which the light is reflected by the grating. For example, if the round-trip optical length of a photon (quantum of the laser's energy embodied in a range of wavelengths) of the laser that reflects back from the grating to the laser source does not have a wavelength that is an integer division of the desired laser wavelength, then destructive effects can occur to the desired laser photon.

Figure 6:
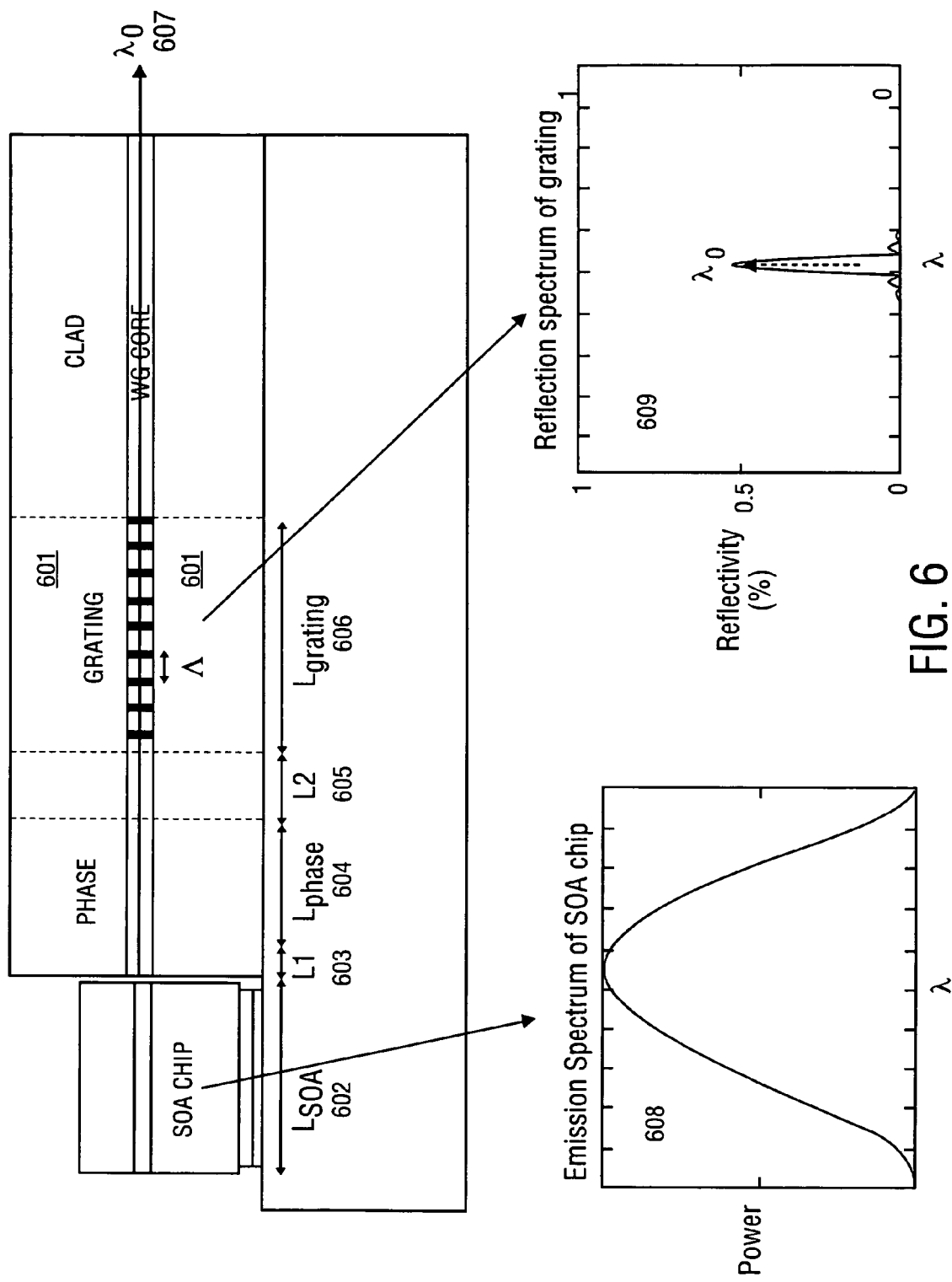
FIG. 6 illustrates a laser generating system according to one embodiment in which a phase is substantially maintained across temperature variances.

FIG. 6 illustrates a laser generating system according to one embodiment of the invention, in which a polymer segment has been introduced to the clad material of the wave guide between the SOA chip and the grating. The polymer segment 601 extends into the optical mode of the wave guide enough to satisfy the above equations relating to wavelength stability and is of an appropriate length along the wave guide core to create a stable laser phase that is substantially independent of temperature variations.

A desired optical round trip distance traveled by the photons reflected back to the SOA chip from the grating is maintained in the embodiment illustrated in FIG. 6 by choosing relative lengths of the clad material segments and the polymer segments that satisfy the following equation:

$$2 \cdot (n_{eff,SOA} \cdot L_{SOA} + n_{eff,L1} \cdot L1 + n_{eff,phase} \cdot L_{phase} + n_{eff,L2} \cdot L2 + n_{eff,grating} \cdot L_{grating}/2) = m \cdot \lambda_0$$

In the above equation, the summation of the multiplicative products of the refraction indices of the various segments between the SOA chip and the grating ($n_{eff,SOA}$, $n_{eff,L1}$, $n_{eff,phase}$, $n_{eff,L2}$, and $n_{eff,grating}$) and the lengths of the respective segments ($L_{SOA}$, $L_{L1}$, $L_{phase}$, $L_{L2}$, and $L_{grating}$) 602, 603, 604, 605, 606 are a constant integer multiple of the desired laser wavelength 607. The entire sum is multiplied by two to account for the round trip of the laser photon. In other embodiments, other methods of determining the length of clad, core, and polymer segments in order to stabilize the effective phase of the laser generating device may be used.

Also illustrated in FIG. 6 is a graph 608 showing the emission spectrum power of the SOA chip and a graph 609 showing the reflectivity percentage of the grating at various wavelengths along the laser spectrum. The graph 609 indicates that the grating effectively passes the highest power spectral range of the laser and reflects the rest in at least one embodiment of the invention.

Although a polymer is used in the above embodiments of the invention, other materials may be used in addition to or instead of the polymer that possess refraction indices suitable to stabilize the effective refraction index and/or phase of a particular clad material. Furthermore, the distribution, concentration, and position of the polymer or other material(s) are different in other embodiments depending in part upon the physical characteristics of the clad and the laser generating system. Similarly, the SOA chip is only one example of a laser source that may be used with embodiments of the invention. Other laser sources, including those integrated within the wave guide, may be used in other embodiments of the invention.

While the invention has been described with reference to illustrative embodiments, this description is not intended to be construed in a limiting sense. Various modifications of the illustrative embodiments, as well as other embodiments, which are apparent to persons skilled in the art to which the invention pertains are deemed to lie within the spirit and scope of the invention.

What is claimed is:

1. An apparatus comprising:
   a wave guide clad having an effective refraction index that is dependent upon a portion of the area of a side of a second material coplanar with and existing within a cross-section of only a portion of an optical mode surrounding a wave guide core, the wave guide core formed of a first material and not including the second material; and
   a grating region formed between a first segment of the wave guide clad and a second segment of the wave guide clad, the second material included in a front end and a rear end of the grating region.

2. The apparatus of claim 1 wherein the wave guide core has the first material having a refraction index whose magnitude contributes to an increase in the refraction index of the first material in response to the temperature variation and a refraction index of the second material has a magnitude that contributes to a decrease in the refraction index of the second material in response to a temperature variation.

3. The apparatus of claim 2 further comprising a source for producing light.

4. The apparatus of claim 3 wherein the grating region is to reflect a portion of the light as the light passes through the wave guide core.

5. The apparatus of claim 4 wherein the second material is a polymer that is formed within the grating region and is partially within the optical mode and on opposite sides of the optical mode surrounding the wave guide core.

6. The apparatus of claim 1 wherein portions of the first material and the second material contribute to an effective refraction index of the wave guide clad.

7. The apparatus of claim 1 wherein the effective refraction index is equal to a first sum of the products of the coplanar cross-sectional areas of the second material existing within the optical mode and the refraction index of the second material, the wave guide core and the refraction index of the wave guide core, the first material and the refraction index of the first material, the first sum being divided by a second sum of the cross-sectional areas of the second material existing within the optical mode, the wave guide core, and the first material.

8. An apparatus comprising:
   first means for stabilizing a light's wavelength within a wave guide, the wave guide having an effective refraction index that is dependent upon a portion of the area of a first segment and a second segment of a polymer material coplanar with and existing within a cross-section of an optical mode surrounding a wave guide core, wherein the first and second segments are present on opposing sides of the wave guide core.

9. The apparatus of claim 8 wherein variations of the light's wavelength in response to temperature variations of the wave guide depends upon the amount of the polymer material in relation to another material within the optical mode of the wave guide.

10. The apparatus of claim 9 wherein the polymer exists on opposite ends of a grating within the wave guide.

11. The apparatus of claim 9 further comprising a second means for stabilizing the phase of the light across varying temperatures of the wave guide.

12. The apparatus of claim 11 wherein the second means comprises the two materials in proportionate amounts so as to make a round-trip refraction distance of a photon of the light substantially independent of temperature.

13. The apparatus of claim 8 wherein the effective refraction index for the wave guide is dependent upon the product of a length of the first and second segments and the refraction index of the polymer material.

14. An apparatus comprising:
   first means for stabilizing a light's phase within a wave guide, the first means comprising a polymer material, the wave guide having an effective refraction index that is dependent upon a portion of the area of a first segment and a second segment of the polymer material that is coplanar with and existing within a cross-section of an optical mode surrounding a wave guide core.

15. The apparatus of claim 14 wherein the polymer material is distributed in the first segment and the second segment along the length of a wave guide core and not extending into the wave guide core.

16. The apparatus of claim 15 wherein the light's wavelength depends upon the length of the first and second segments multiplied by an effective refractive index of each segment, the effective refractive index of each segment depending upon an amount of the polymer material distributed within the optical mode of the wave guide.

17. The apparatus of claim 16 wherein an effective refraction index of the wave guide is substantially constant from a first end of the wave guide through a grating of the wave guide.

18. The apparatus of claim 17 wherein the light is produced by a source external to the wave guide.

19. The apparatus of claim 17 wherein the light is produced by a source internal to the wave guide.

20. The apparatus of claim 18 wherein the source of the light is a semiconductor optical amplifier (SOA) chip.

21. The apparatus of claim 20 wherein the wavelength of the light substantially corresponds to the maximum power within the emission spectrum of the SOA.

22. A system comprising:
   a light source to emit a spectrum of light wavelengths;
   a wave guide to guide light from the light source having a first wavelength, the wave guide having:
      a first portion coupled between the light source and a grating portion;
      the grating portion coupled between the first portion and a second portion; and
      a wave guide core surrounded by an optical mode formed of a clad, the clad including a first material and a polymer, wherein the polymer is formed in a first trench and a second trench, each of which extends into a portion of the optical mode but not into the wave guide core.

23. The system of claim 22 wherein the refraction index of the polymer changes in opposite magnitude of the first material of the wave guide in response to temperature variations.

24. The system of claim 23 wherein the effective refraction index of the clad depends upon the relative amounts of polymer and other clad material existing within the optical mode of the wave guide.

25. The system of claim 24 wherein the phase of the light is substantially independent of temperature variations within the wave guide.

26. The system of claim 24 wherein the wavelength of the light is substantially independent of temperature variations within the wave guide.

27. The system of claim 24 wherein the polymer is present at opposite ends of the grating portion.

28. The system of claim 27 wherein the light source comprises a semiconductor optical amplifier (SOA) to amplify the reflected light wavelengths, and wherein the polymer is present in the first portion.

29. The apparatus of claim 5, wherein the polymer is present between a semiconductor optical amplifier chip and the grating region within the wave guide.

30. The apparatus of claim 8, wherein a length of the first and second segments is to create a laser phase that is substantially temperature independent.

31. The apparatus of claim 8, wherein the wave guide core is formed of a first material and not including the polymer material.

32. The apparatus of claim 15, wherein the wave guide core is formed of a first material and not including the polymer material.

* * * * *